United States Patent
Kintis

(10) Patent No.: US 7,042,960 B2
(45) Date of Patent: May 9, 2006

(54) LOW ORDER SPUR CANCELLATION MIXER TOPOLOGIES

(75) Inventor: Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 757 days.

(21) Appl. No.: 09/941,403

(22) Filed: Aug. 28, 2001

(65) Prior Publication Data
US 2003/0078020 A1 Apr. 24, 2003

(51) Int. Cl.
*H04L 27/20* (2006.01)

(52) U.S. Cl. .............. 375/308; 375/239; 375/279; 375/329

(58) Field of Classification Search ........... 375/308; 455/209, 210
See application file for complete search history.

(56) References Cited

U.S. PATENT DOCUMENTS

| | | |
|---|---|---|
| 4,641,369 A | 2/1987 | Grote et al. |
| 4,841,169 A | 6/1989 | Tsironis et al. |
| 5,428,838 A | 6/1995 | Chang et al. |
| 5,794,131 A | 8/1998 | Cairns et al. |
| 5,903,555 A | 5/1999 | Wildauer et al. |
| 6,054,889 A | 4/2000 | Kobayashi et al. |
| 6,078,802 A | 6/2000 | Kobayashi et al. |
| 6,144,236 A | 11/2000 | Vice et al. |

OTHER PUBLICATIONS

"Effects of Offsets on Bipolar Integrated Circuit Mixer Even-Order Distortion Terms", by Coffing, et al., *IEEE Transactions on Microwave Theory and Techniques*, vol. 49, No. 1, Jan. 2001, pp. 23-30.

"An Actively Balanced GaAs HBT-Schottky Mixer for 3-V Wireless Applications", by Kobayashi, et al., *IEEE Microwave and Guided Wave Letters*, vol. 7, No. 7, Jul. 1997, pp. 181-183.

"An 18-22-GHz Down-Converter Based on GaAs/AlGaAs HBT-Schottky Diode Integrated Technology", by Kobayashi, et al., *IEEE Microwave and Guided Wave Letters*, vol. 7, No. 4; Apr. 1997, pp. 106-108.

*Microwaves and Wireless Simplified*, by T. S. Laverghetta, Artech House 1998, pp. 90-92.

Primary Examiner—Stephen Chin
Assistant Examiner—Erin M. File
(74) Attorney, Agent, or Firm—Katten Muchin Rosenman LLP; John S. Paniaguas

(57) ABSTRACT

Various mixer topologies, configured to cancel various low order spurs. The mixer topologies each include a pair of mixers and a plurality of couplers. The couplers are configured to cancel specific spurs. As such, the mixer topology eliminates the need for band splitting thus allowing larger input frequency ranges and allows for simpler and less expensive filtering.

10 Claims, 1 Drawing Sheet

LOW ORDER SPUR CANCELLATION MIXER TOPOLOGIES

CROSS-REFERENCE TO RELATED APPLICATIONS

The present application is related to commonly-owned copending patent application entitled; "Phase Modulation Power Spreading Used to Reduce RF or Microwave Transmitter Output Power Spur Levels," by Mark Kintis, application Ser. No. 09/941,371, filed on Aug. 28, 2001, hereby incorporated by reference.

BACKGROUND OF THE INVENTION

1. Field of the Invention

The present invention relates to RF and microwave mixers and more particularly to mixer topologies configured to cancel low order spurious output signals (also known as spurs).

2. Description of the Prior Art

Mixers are generally known in the art and are used in various applications for upconverting or downconverting microwave and RF signals having a frequency $f_1$ to a higher or lower frequency for by way of a local oscillator. More particularly, such mixers are non-linear devices with two input ports and one output port. One input port is used for receiving microwave or RF input signals having a frequency $f_1$ while the other input port is for a local oscillator signal having a frequency $f_2$. When signals having frequencies $f_1$ and $f_2$ are applied to the input ports, the following signals are generated at the output port: the original signals, $f_1$, $f_2$; harmonics of the signals 2 $f_1$ and 2 $f_2$, etc; the sum and differences of the signals $f_1$ and $f_2$; as well as the sum and differences of each of the harmonics of the signals $f_1$ and $f_2$. In general, the output signals available at the output of a mixer are provided by equation (1) below:

$$f_{output} = \pm M^* f_1 \pm N^* f_2 \text{, where } M \text{ and } N \text{ are integers} \\ \text{and the sum } |M|+|N|=\text{"order" of the mixer output} \\ \text{signal frequency.} \quad (1)$$

The mixer output signals are normally identified by their respective coefficients. For example, a spur at 2 $f_1$+2 $f_2$ is identified as (2, 2). Similarly, the spur at 2 $f_1$+$f_2$ is identified as (2, 1). The signal $f_1$ is identified as (1, 0) while the signal $f_2$ is identified as (0, 1). The harmonics of these signals may are also identified using the coefficient notation. For example, the spur at 2 $f_2$ is identified as (0, 2) while the spur 2 $f_1$ is identified as (2, 0).

When the mixer is used as an upconverter, the desired output frequency of the mixer is greater than the RF input signal, $f_1$+$f_2$, for example. Similarly, when the mixer is used as a downconverter, the desired output of the mixer is lower than the RF input signal, $f_1$−$f_2$, for example. The balance of the signals available at the output of the mixer are undesirable and are therefore spurious output signals, or simply spurs. Such spurs are well known and relate to the inherent characteristics of the mixers, for example, as disclosed in "Effects of Offsets on Bipolar Integrated Circuit Mixer Even-Order Distortion Terms", by Coffing et al., *IEEE Transactions On Microwave Theory and Techniques*, Vol. 49, No. 1, January 2001, pages 23–30, hereby incorporated by reference.

Many of the spurs at the mixer output port can oftentimes simply be filtered out with simple low pass or band pass filters. In addition, the power level of many of the spurs decreases the further the spur frequency is away from the desired output frequency. Thus, due to this low power level, many of the spurs are simply ignored. However, spurs which occur in the desired frequency band or close to the frequency band are problematic and cause interference. Various techniques are known to be used to eliminate low order spurs which cause interference. For example, in one known application, the band is split and multiple stage mixers are used. In such an application, the band split is selected to eliminate various low order spurs. For example, in known downconverter applications, the (2, 1) and (2, 2) spurs are known to drive the band splits. In other known applications, the low order spurs are filtered out by relatively complex and expensive narrow band filters. Both of these techniques degrade the overall performance of the system. Thus, what is needed is a mixer topology which cancels out low order spurs in order to eliminate the need for band splitting and relatively expensive and complex narrow band filters.

SUMMARY OF THE INVENTION

The present invention relates to various mixer topologies, configured to cancel various low order spurs. The mixer topologies each include a pair of mixers and a plurality of couplers. The couplers are configured to cancel specific spurs. As such, the mixer topology eliminates the need for band splitting thus allowing larger input frequency ranges and allows for simpler and less expensive filtering.

DESCRIPTION OF THE DRAWINGS

These and other advantages of the present invention are readily understood with reference to the following specification and attached drawing wherein.

DETAILED DESCRIPTION

Figure 1:
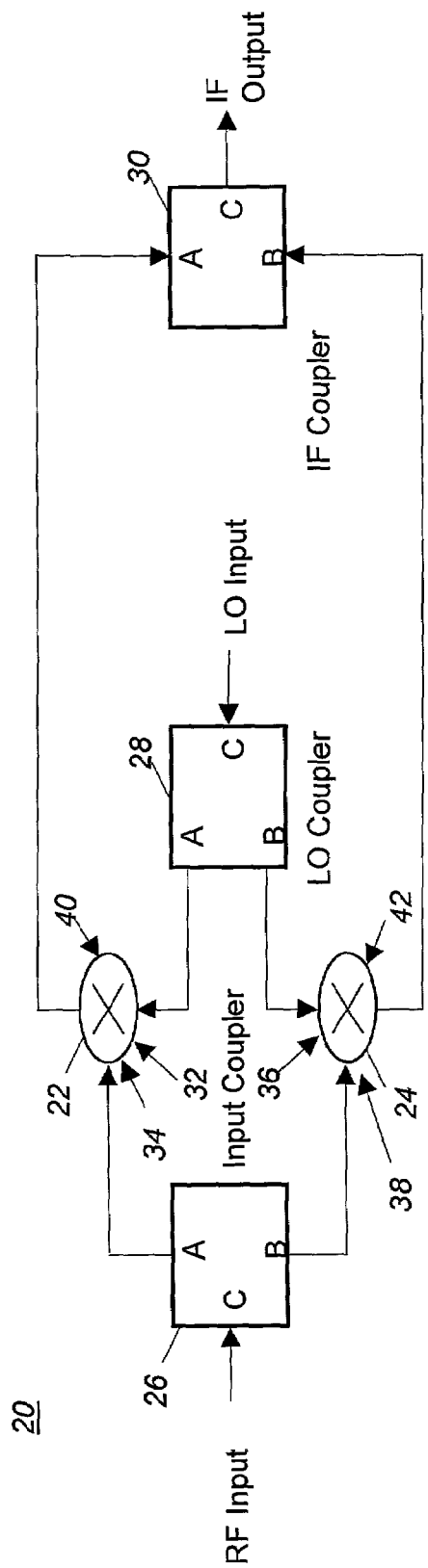
FIG. 1 is a generic block diagram of a mixer topology in accordance with the present invention.

The present invention relates to a mixer topology that is configured to cancel relatively low level spurious output signals or spurs without the need for band splitting or relatively complex and expensive filtering. The mixer topology in accordance with the present invention utilizes couplers, such as quadrature hybrid couplers in phase power splitters or 0°/180° phase power splitters, for power splitting and phase shifting of various undesirable spurs causing them to cancel while passing signals at the desired frequency.

The basic mixer topology in accordance with the present invention is illustrated in FIG. 1 and generally identified with the reference numeral 20. The mixer topology 20 includes a pair of mixers 22 and 24 and three coupling devices 26, 28 and 30, such as quadrature, in phase or out of phase couplers, configured to split the power level of the input signals equally. By properly selecting the configuration of the coupling devices 26, 28 and 30, the unwanted spurs are canceled by phase shifting and power dividing as will be discussed in more detail below.

Each mixer 22, 24 contains two input ports and one output port. In particular, the mixer 22 includes two input ports 32 and 34 and an output port 40 while the mixer 24 includes two input ports 36 and 38 and an output port 42, respectively. As is known in the art, each of the couplers includes two pairs of ports which can be used as inputs or outputs. As shown, the input coupler 26 and local oscillator (LO) input coupler 28, utilize the A and B ports as output ports and the C port as an input port. The intermediate frequency (IF) coupler 30, conversely utilizes the A and B ports as input ports in the C port as an output port. Each of the couplers 26, 28 and 30 include a fourth port (not shown) that is terminated to a fixed impedance, for example, 50Ω.

Referring to FIG. 1, a local oscillator (LO) signal is applied to the C port of the LO coupler 28. The LO coupler 28 splits the LO signal into two signals, for example, equal power signals, and applies them to the input ports 32 and 36 of the mixers 22 and 24, respectively. These LO input signals are mixed with an RF input signal, which, in turn, is split by the input coupler 26. More specifically, the input coupler 26 splits the RF input signal into two signals, for example, equal power signals, and applies them to the other input ports 34 and 38 of the mixers 22 and 24, respectively. The output ports 40 and 42 of the mixers 22 and 24 are, in turn, applied to the input ports A and B of the IF coupler 30, respectively. The mixer output signal is available at the output port C of the IF coupler 30.

In accordance with an important aspect of the invention, the selection of the phase shifting between the input ports and the output ports of the couplers 26, 28 and 30 is used to phase shift predetermined spurs so that they are canceled at the output port C of the IF coupler 30 for the desired mixer output signal (1, 1), (−1, 1) or (1, −1). The principles of the present invention can be used to cancel spurs for any of the desired mixer products (1, 1), (−1, 1) or (1, −1).

The (1, 1) mixer product represents the sum of the RF and LO signals $f_1+f_2$. This mixer product $f_1+f_2$ is typically used for upconversion. For example, an RF input frequency $f_1$ of 25 MHz can be upconverted to a frequency of 125 MHz by selecting a LO frequency of 100 MHz.

The (−1, 1) and (1, −1) mixer products, $(f_2-f_1)$ and $(f_1-f_2)$, respectively are typically used in down-conversion applications. Proper selection of the mixer output signal (−1, 1) or (1, −1) depends on the input RF frequency $f_1$ and the desired output frequency. For example, if the RF input frequency $f_1$ is 35 MHz and the desired output frequency is 12 MHz, selection of the (−1, 1) mixer output provides optimum results. In this example, the LO frequency $f_2$ is selected as 37 MHz to provide a mixer output frequency of (−25+37) 12 MHz.

If the (1, −1) mixer output signal was chosen in the above example, the LO frequency $f_2$ would have to be selected as 13 MHz, relatively close to the desired output frequency of 12 MHz. Since the LO signal frequency leaks (i.e. the (0, 1) spur), filtering of the LO leakage would have relatively difficult.

However, in some applications, such as applications requiring a very low noise component, the best choice for the LO frequency $f_2$ is to be less than the RF input signal. In such applications, the (1, −1) mixer output is selected. By selecting the (1, −1) output signal, the lower LO signal $f_2$ will generate lower overall noise in the output signal.

As mentioned above, in connection with Equation 1, the mixer output signal $f_{output}$ includes the desired output frequency (1, 1), (−1, 1) or (1, −1) and spurs. Depending on the application, various spurs for a selected output frequency (1, 1), (−1, 1) or (1, −1) can be eliminated by mere selection of mixer topology in accordance with the present invention. For example, Table 1 illustrates a number of exemplary mixer topologies or configurations of the couplers 26, 28 and 30 and the respective spur products canceled by each topology for a desired output frequency (−1, 1). As shown, each topology is used to cancel different spurs. Selection of the particular topology is based upon simplifying filtering of the undesired mixer products.

Table 1 is merely exemplary for the (−1, 1) mixer output signal. Other tables are easily generated for the (1, −1) and (1, 1) mixer output signals.

TABLE 1

| Topology | Mechanism to be Canceled | Input | | LO | | Output | |
|---|---|---|---|---|---|---|---|
| | | C → A | C → B | C → A | C → B | C → A | C → B |
| 1 | (0, 1) (1, 0) | 0° | 180° | 180° | 0° | 0° | 0° |
| 2 | (2, 0), (0, 2) | 0° | 180° | 0° | 0° | 0° | 180° |
| 3 | (2, 0), (0, 2) | 0° | 0° | 0° | 180° | 0° | 180° |
| 4 | (−2, 1) | 0° | 180° | 0° | 180° | 0° | 0° |
| 5 | (2, −1) | 0° | 180° | 0° | 0° | 0° | 180° |
| 6 | (2, 1) | 0° | 180° | 180° | 0° | 0° | 0° |
| 7 | (−2, 2) | 0° | 180° | 0° | 0° | 180° | 0° |
| 8 | (2, −2) | 0° | 180° | 0° | 0° | 180° | 0° |
| 9 | (2, 2) | 0° | 180° | 0° | 0° | 180° | 0° |
| 10 | (−1, 2) | 0° | 0° | 0° | 180° | 0° | 180° |
| 11 | (1, −2) | 0° | 180° | 0° | 180° | 0° | 0° |
| 12 | (1, 2) | 0° | 180° | 180° | 0° | 0° | 0° |
| 13 | (−1, 3) | 90° | 0° | 0° | 90° | 0° | 0° |
| 14 | (1, −3) | 90° | 0° | 0° | 90° | 0° | 0° |
| 15 | (1, 3) | 90° | 0° | 0° | 90° | 0° | 0° |

Referring to Table 1, the first column identifies an exemplary fifteen (15) mixer topologies. The second column identifies the respective spurs canceled. It should also be noted that different mixer topologies may be used to cancel the same spurs. For example, either of the topologies 2 or 3 may be used to cancel the spurs (2, 0) and (0, 2).

The only differences in the various exemplary topologies 1–15 are the configuration of the couplers 26, 28 and 30 and specifically the phase shifts between the input ports and the output ports. The specific configurations for couplers 26, 28 and 30 for each of the mixer topologies 1–15 is provided in the 3–8 columns of Table 1. Two columns are used to designate the configurations for each of the couplers 26, 28 and 30 and are designated as "Input", "LO" and "Output". The two columns for each coupler 26, 28 and 30 are designated as "C→A" or "C→B" which designate the specific phase shifts between each of "A", "B" and "C" ports for each couplers 26, 28 and 30. A designation of "0°" indicates no phase shift while a designation of "180°" indicates a 180° phase shift. For example, referring to the mixer topology 1, the specific input coupler 26 is designated as having a 0° phase shift between the input port "C" and the output port "A". This coupler 26 is also configured with a 180° phase shift between the input port "C" and the output port "B".

As is known in the art, the couplers 26, 28 and 30 can be implemented to provide either a 0°, 90° or 180° phase shift. A 180° phase shift is essentially the same as multiplying the signal by (−1). As such, with a general mixer topology as illustrated in FIG. 1, the configuration of the couplers 26, 28 and 30 can be selected to cancel specific spurs as illustrated in Table 1. For illustration purposes, the output signals from the LO coupler, input coupler and the pair of mixers are described below to demonstrate the particular spurs canceled for mixer topology 1, configured to cancel the (1, 0) and (0, 1) spurs per Table 1. Referring to FIG. 1, an RF input signal having a frequency $f_1$ is applied to the C input of the input coupler 26. Assuming that the input coupler 26 is an equal power divider coupler, a half power signal at a frequency $f_1$ is generated at the A output port and a half power signal ($-f_1$), due to the 180° phase shift between the C input port and B output port for this topology, is generated at the output port B of the input coupler 26.

A LO signal having a frequency of $f_2$ is applied to the input port C of the LO coupler 28. Due to the configuration of the LO coupler 28 from Table 1, a signal $-f_2$ is applied to the other input port of the mixer 32 while a signal $f_2$ is applied to the other input port of mixer 36. In general, the mixer products are in the form as set forth in equation (2) below.

$$f_1, f_2, f_1+f_2, f_1-f_2, 2f_1, 2f_2, \text{etc.} \quad (2)$$

As such, with input signals of $f_1$ and $-f_2$, the output of the mixer 40 is provided in equation (3) below.

$$f_1, (0°), f_2(180°), [f_1-f_2(180°)], 2f_1(0°), 2f_2(360°). \quad (3)$$

The signals $-f_1$ and $f_2$ are applied to the mixer 42. As such, the output of the mixer 42 is as provided in equation (4) below.

$$f_1(180°), f_2(0°), [f_1-f_2(180°)], [f_1+f_2(180°)], 2f_1(360°) \quad (4)$$

In this example, since the IF coupler 30 is a zero phase coupler (i.e. no phase shift between A→C and B→C ports), the mixer products for each frequency from the mixers 58 and 60 are simply algebraically added as indicated in Table 2 below.

TABLE 2

|  | A | B | C (Result) |
|---|---|---|---|
| $f_1$ | 0° | 180° | Cancel |
| $f_2$ | 180° | 0° | Cancel |
| $f_1 - f_2$ | 180° | 180° | Add |
| $f_1 + f_2$ | 180° | 180° | Add |
| $f_2 - f_1$ | 180° | 180° | Add |
| $2f_1$ | 0° | 360° | Add |
| $2f_2$ | 360° | 0° | Add |

As can be seen from Table 2, the signals $f_1$ and $f_2$ all cancel out. As such, the specific configuration of the mixer topology 1 provides cancellation of the signals (1, 0) and (0, 1) spurs. These spurs are the IF and LO leakage signals, respectively, which are often particularly problematic.

As will be understood by those of ordinary skill in the art, the other configurations illustrated in Table 1 cancel the respective spurs indicated. As will also be understood by those of ordinary skill in the art, the amplitude and phase balance of the spur to be canceled must be relatively well matched. In monolithic microwave integrated circuits (MMIC) implementations, such a constraint is easily met. However, in non-MMIC implementations, the differences between the spurs to be canceled may be relatively difficult and without compensation may negate the cancellation.

Obviously, many modification and variations of the present invention are possible in light of the above teachings. For example, thus, it is to be understood that, within the scope of the appended claims, the invention may be practiced otherwise than as specifically described above to cancel the spurious signals other than these listed in Table 1.

What is claimed and desired to be secured by Letters Patent of the United States is:

I claim:

1. A mixer topology configured to reduce predetermined spurious output signals, the mixer topology comprising:
   an input coupler having an input port for receiving a first signal having a frequency $f_1$ and two output ports, said input port configured with predetermined phase shifts between said input port and said two output ports;
   a local oscillator (LO) coupler having an input port for receiving a local oscillator signal having a frequency $f_2$ and two output ports, said LO coupler configured with predetermined phase shifts between said input port and said two output ports;
   an intermediate frequency (IF) coupler with two input ports and output port, said IF coupler configured with predetermined phase shifts between said two input ports and said output port;
   a first mixer having two input ports and an output port, said input ports of said first mixer each electronically coupled to one of said two input ports of said input coupler and one of said output port of said LO coupler, said output port of said first mixer electrically coupled to one of said two input parts of said IF coupler; and
   a second mixer having two input ports and an output port, said input ports of said second mixer each electrically coupled to the other of said two input ports of said input coupler and the other output port of said LO coupler, said output port of said second mixer electrically coupled to the other of said two input ports of said IF coupler, wherein said input coupler, LO coupler and IF coupler and said first and second mixers are configured to cancel one or more output signals of said first and second mixers other than $f_1$ and $f_2$.

2. The mixer topology as recited in claim 1, wherein said predetermined phase shifts of said input coupler include a 180° phase shift.

3. The mixer topology as recited in claim 1, wherein said predetermined phase shifts of said IF coupler include a 180° phase shift.

4. The mixer topology as recited in claim 1, wherein said predetermined phase shifts of said IF coupler include a 180° phase shift.

5. The mixer topology as recited in claim 1, wherein said one or more other preselected spurs include the (2, 0) spur.

6. The mixer topology as recited in claim 1, wherein said one or more other preselected spurs include the (0, 2) spur.

7. The mixer topology as recited in claim 1, wherein said one or more other preselected spurs include the (2, 1) spur.

8. The mixer topology as recited in claim 1, wherein said one or more other preselected spurs include the (2, 2) spur.

9. The mixer topology as recited in claim 1, wherein said one or more other preselected spurs include the (1, 2) spur.

10. The mixer topology as recited in claim 1, wherein said one or more other preselected spurs include the (1, 3) spur.

* * * * *